United States Patent
Wu et al.

(10) Patent No.: US 8,693,872 B2
(45) Date of Patent: Apr. 8, 2014

(54) WAVELENGTH ADJUSTING METHOD, APPARATUS, AND SYSTEM

(75) Inventors: Shuangqi Wu, Shenzhen (CN); Fei Tang, Shenzhen (CN); Hongping Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 271 days.

(21) Appl. No.: 13/097,817

(22) Filed: Apr. 29, 2011

(65) Prior Publication Data

US 2011/0200334 A1    Aug. 18, 2011

Related U.S. Application Data

(63) Continuation of application No. PCT/CN2009/074663, filed on Oct. 28, 2009.

(30) Foreign Application Priority Data

Oct. 31, 2008    (CN) .......................... 2008 1 0218820

(51) Int. Cl.
*H04J 14/02*    (2006.01)
*H04B 10/00*    (2013.01)

(52) U.S. Cl.
USPC ................... 398/79; 398/43; 398/45; 398/54; 398/95

(58) Field of Classification Search
USPC ................................................ 398/79, 42, 43
See application file for complete search history.

(56) References Cited

U.S. PATENT DOCUMENTS

| 6,370,169 B1 * | 4/2002 | Imajuku et al. ................. 372/32 |
| 7,068,949 B2 | 6/2006 | Jung et al. |
| 2002/0048063 A1 * | 4/2002 | Jung et al. ..................... 359/124 |
| 2004/0208565 A1 * | 10/2004 | Roberts et al. .................. 398/79 |
| 2009/0232493 A1 * | 9/2009 | Tu .................................. 398/17 |

FOREIGN PATENT DOCUMENTS

| CN | 101247199 A | 8/2008 |
| JP | 2001111168 A | 4/2001 |
| JP | 2003273806 A | 9/2003 |
| WO | WO 0230015 A2 | 4/2002 |
| WO | WO 2008098457 A1 * | 8/2008 |

OTHER PUBLICATIONS

Extended European Search Report in corresponding European Patent Application No. 09823076.6 (Jun. 5, 2012).
1st Office Action in corresponding Japanese Patent Application No. 2011-533519 (Oct. 2, 2012).
State Intellectual Property Office of the People's Republic of China, International Search Report in International Patent Application No. PCT/CN2009/074663 (Feb. 4, 2010).
Written Opinion of the International Searching Authority in corresponding PCT Application No. PCT/CN2009/074663 (Feb. 4, 2010).

* cited by examiner

*Primary Examiner* — Oommen Jacob
(74) *Attorney, Agent, or Firm* — Leydig, Voit & Mayer, Ltd.

(57) ABSTRACT

A wavelength locking method, apparatus, and system are provided. The wavelength locking method includes modulating, by using scrambling signals with a same frequency and different phases, each one of a plurality of optical channel signals respectively; processing, by a combiner, a splitter, and a wavelength locker, the modulated optical signals, so as to acquire photoelectricity detector (PD) signals; performing phase discrimination on the PD signals to acquire wavelength information of the optical channels; determining different shift values corresponding to the different wavelength information; and adjusting wavelengths of the optical channels according to the corresponding shift values.

9 Claims, 5 Drawing Sheets

WAVELENGTH ADJUSTING METHOD, APPARATUS, AND SYSTEM

CROSS-REFERENCE TO RELATED APPLICATIONS

This application is a continuation of International Application No. PCT/CN2009/074663, filed on Oct. 28, 2009, which claims priority to Chinese Patent Application No. 200810218820.2, filed on Oct. 31, 2008, both of which are hereby incorporated by reference in their entireties.

FIELD OF THE INVENTION

The present invention relates to the field of optical communication technologies, and more particularly, to a wavelength adjusting method, apparatus, and system.

BACKGROUND OF THE INVENTION

As the communication services continuously develop, a communication network requires larger transmission bandwidth and transmission capacity. Therefore, a Dense Wavelength-Division Multiplexing (DWDM) system is widely used. In order to prevent the multi-wavelength optical crosstalk, the output light wave of each optical-module laser must work at a particular wavelength. The wavelength of a laser varies with the temperature, and there is a system in a common optical module for locking and controlling the wavelength, so as to control the wavelength in a desired range. Scrambling technology is applied in the locking and controlling process of the wavelength, and a conventional scrambling manner is to perform scrambling on each laser respectively. In the multi-wavelength DWDM application, if the conventional manner of scrambling each laser is used, the area of a Printed Circuit Board (PCB) and the complexity of a control circuit are definitely increased significantly.

In the current technology for controlling and locking multiple wavelengths, multi-channel "scrambling" is performed to discriminate currently controlled and locked wavelengths, and in an each wave scrambling retrieval manner, an Analog-Digital Converter (ADC) samples a digital signal, and a micro-processor performs Fast Fourier Transformation (FFT) on the digital signal, so as to retrieve different scrambling frequencies of different waves, as shown in FIG. 1. However, each wave must be added with a unique scrambling frequency, the responsivity of a wavelength locker is small, and a photoelectricity detector (PD) signal output from the wavelength locker directly enters the ADC so as to be sampled, which imposes high requirements on the accuracy of the ADC. As the wave number increases, required hardware and software resources are increased dramatically, and critical resources such as Digital/Analog (DA) lane number and micro-processing capability are also challenged.

SUMMARY OF THE INVENTION

Embodiments of the present invention provide a wavelength adjusting method, apparatus, and system, so as to adjust multiple wavelengths by injecting a plurality of scrambling signals with the same frequency and different phases into wavelength channels corresponding to the phases.

In order to solve the above technical problems, a wavelength adjusting method provided in an embodiment of the present invention includes:

modulating, by using scrambling signals with a same frequency and different phases, signals in wavelength channels corresponding to the phases;

optically splitting and wavelength locking the modulated signals to acquire PD signals;

performing phase discrimination on the PD signals, so as to acquire scrambling information of the different phases, in which the scrambling information includes wavelength information of the wavelength channels;

determining wavelength-shift of the scrambling information of the different phases, so as to acquire different shift values corresponding to the wavelength information in the scrambling information of the different phases; and adjusting wavelengths of the wavelength channels of the different phases according to the different shift values.

Correspondingly, a wavelength adjusting apparatus provided in an embodiment of the present invention includes:

an injection module, configured to inject scrambling signals with a same frequency and different phases respectively into wavelength channels corresponding to the phases;

a phase discrimination module, configured to perform phase discrimination on PD signals, so as to acquire scrambling information of different phases, in which the scrambling information includes wavelength information of the wavelength channels;

a wavelength-shift discrimination module, configured to determine wavelength-shift of the scrambling information of the different phases acquired by the phase discrimination module, so as to acquire different shift values corresponding to the wavelength information in the scrambling information of the different phases; and a wavelength control and adjustment module, configured to adjust wavelengths of the wavelength channels of the different phases according to the different shift values.

Correspondingly, a wavelength adjusting system provided in an embodiment of the present invention includes:

a scrambling signal injection apparatus, configured to generate scrambling signals with a same frequency and different phases and inject the scrambling signals respectively into wavelength channels corresponding to the phases;

a signal transmission apparatus, configured to modulate and combine the signals in the wavelength channels;

a splitting and wavelength locking apparatus, configured to optically split and wavelength lock the signals modulated and combined by the signal transmission apparatus, so as to acquire PD signals;

a perturbation retrieval apparatus, configured to perform phase discrimination on the PD signals, so as to acquire scrambling information of different phases, in which the scrambling information includes wavelength information of the wavelength channels; and determine wavelength-shift of the scrambling information of the different phases, so as to acquire different shift values corresponding to the wavelength information in the scrambling information of the different phases; and a wavelength control and adjustment apparatus, configured to adjust wavelengths of the wavelength channels of the different phases according to the different shift values.

According to the embodiments of the present invention, a plurality of scrambling signals with the same frequency and different phases are injected into wavelength channels corresponding to the phases. In this way, the adjustment of multiple wavelengths is achieved, the cost and PCB area are greatly saved, and the complexity of a control circuit is lowered.

BRIEF DESCRIPTION OF THE DRAWINGS

To illustrate the technical solutions according to the embodiments of the present invention, or to illustrate the conventional art more clearly, the accompanying drawings are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

The technical solutions of the present invention will be clearly and completely described in the following with reference to the accompanying drawings. It is clear that the embodiments to be described are only a part rather than all of the embodiments of the present invention. All other embodiments obtained by persons skilled in the art based on the embodiments of the present invention without creative efforts shall fall within the protection scope of the present invention.

Figure 1:
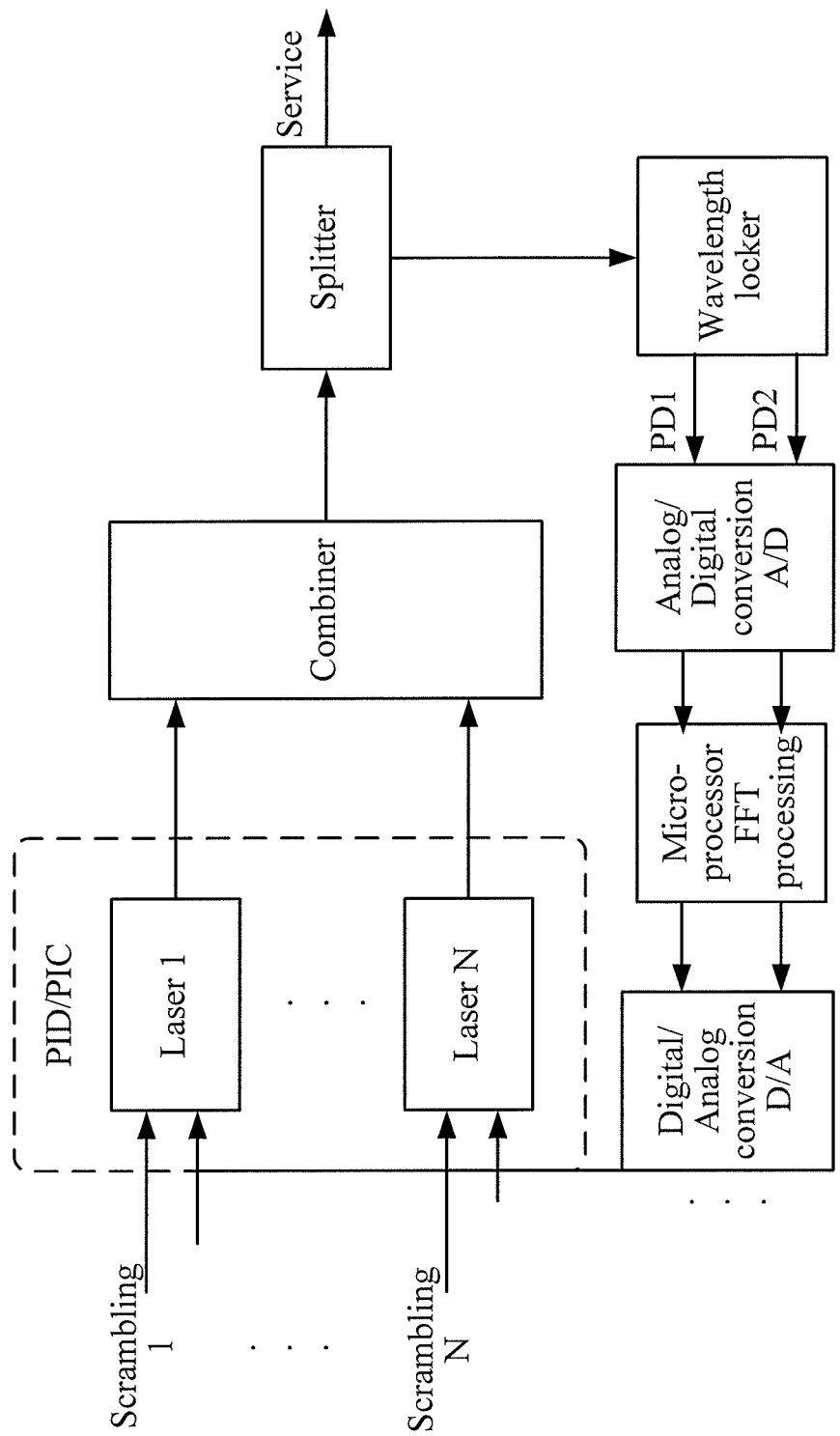
FIG. 1 is a schematic structural diagram of a wavelength locking system in the conventional art.
Figure 2:
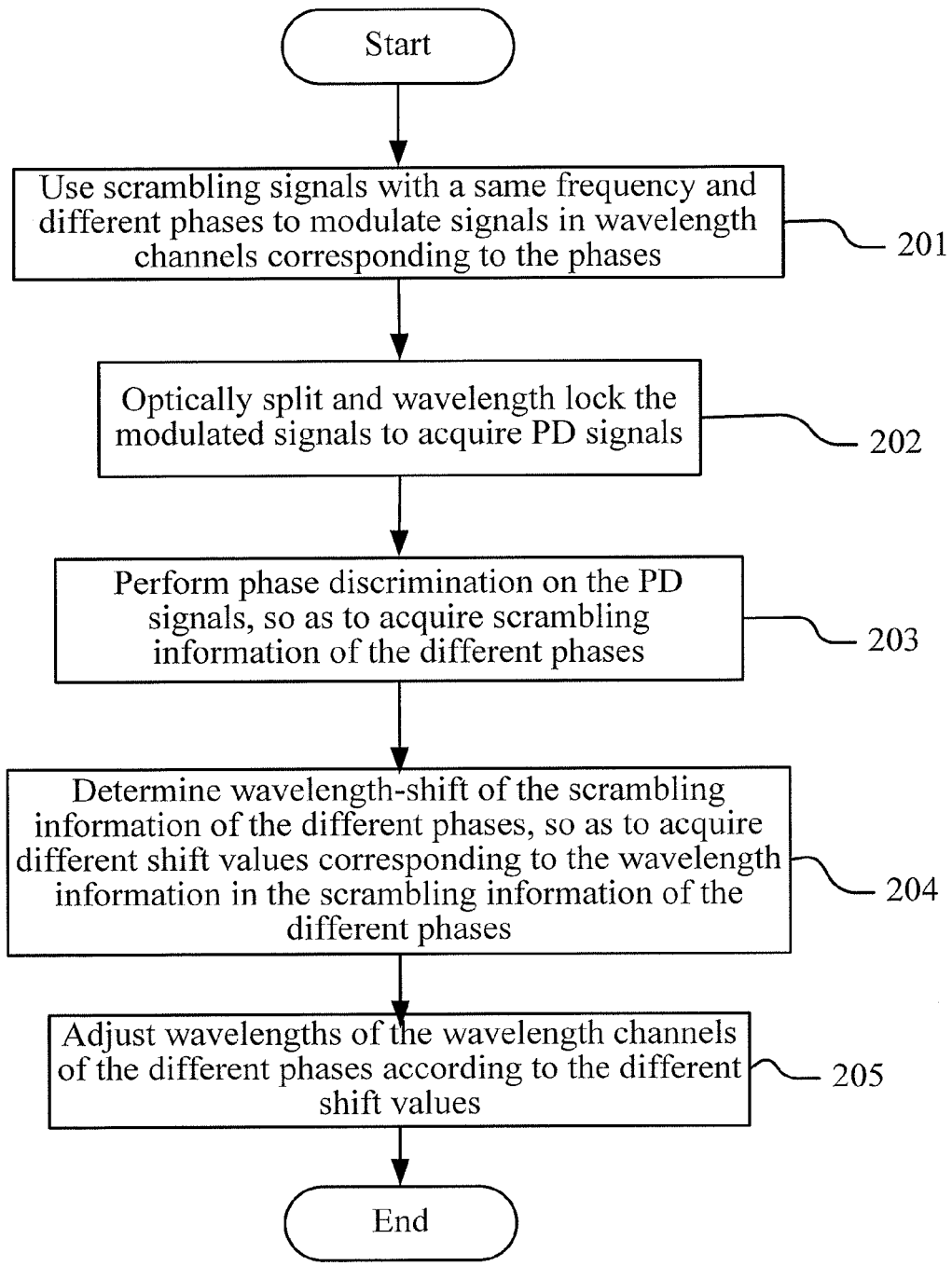
FIG. 2 is a schematic flow chart of a wavelength adjusting method according to an embodiment of the present invention.

FIG. 2 is a schematic flow chart of a wavelength adjusting method according to an embodiment of the present invention. As shown in FIG. 2, the method includes the following steps:

Step 201: Use scrambling signals with a same frequency and different phases to modulate signals in wavelength channels corresponding to the phases.

Step 201 further includes:

generating the scrambling signals with the same frequency and the different phases;

injecting the scrambling signals with the same frequency and the different phases respectively into the wavelength channels corresponding to the phases; and modulating the signals in the wavelength channels according to the scrambling signals.

In implementation, the modulated optical signals may be further combined.

Figure 3:
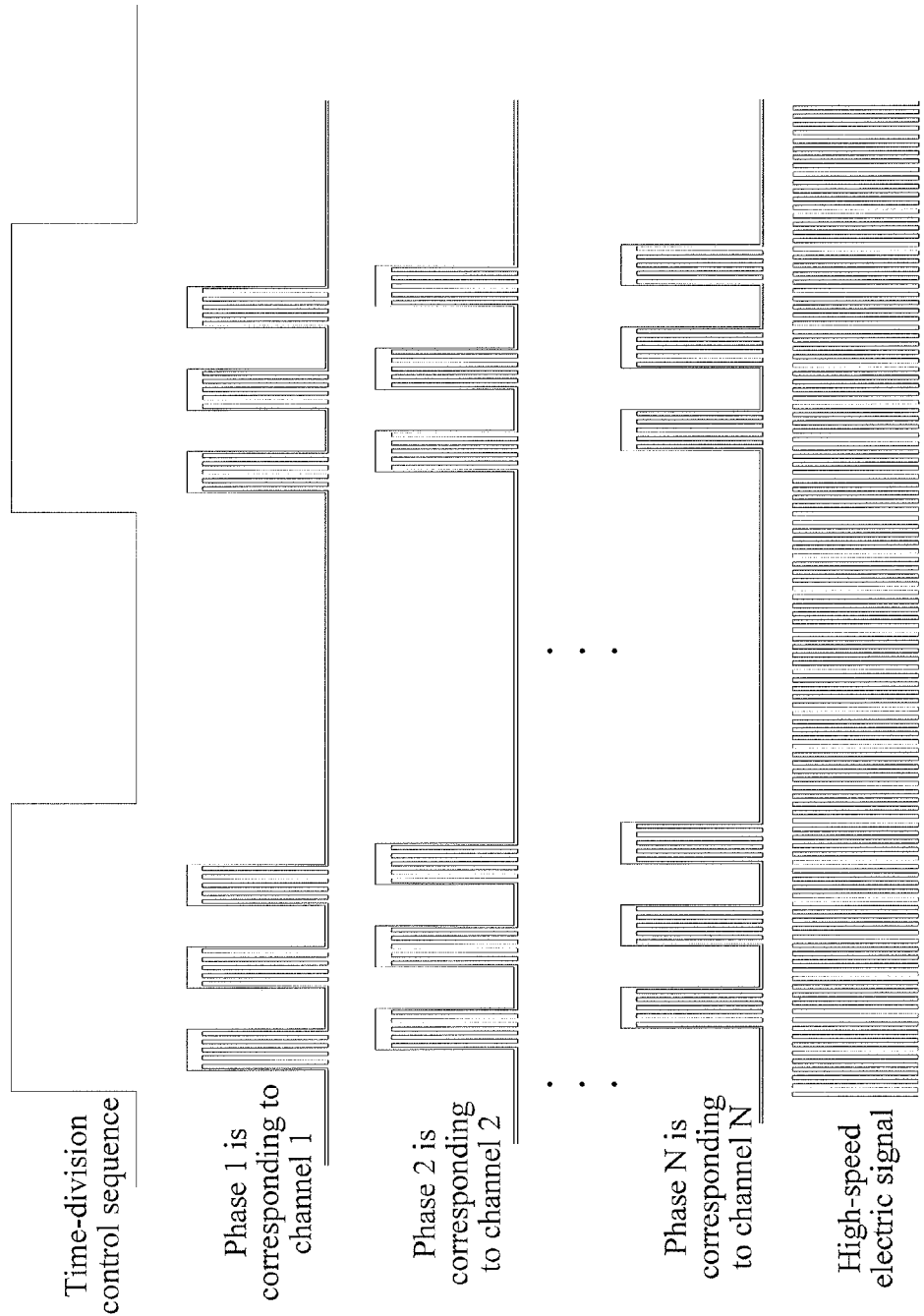
FIG. 3 is a schematic diagram of a time-division and phase-division injection sequence of scrambling signals according to an embodiment of the present invention.

Optionally, in practical operation, the scrambling signals with the same frequency and the different phases may be injected into the wavelength channels corresponding to the phases in a time-division manner. In such a process, a time-division and phase-division injection sequence of the scrambling signals, as shown in FIG. 3, is used to inject the scrambling signals with the different phases into the wavelength channels corresponding to the phases. The time-division control sequence ensures that the scrambling signals are injected in time intervals of high level. The scrambling signals with the different phases are respectively injected into the different wavelength channels, so as to be finally modulated into high-speed electrical signals. If the wave number that needs wavelength lock is N, the phase of each channel wavelength should be sequentially spaced by 360°/N. In view of the phase discrimination ability in a subsequent perturbation retrieval process, when the channel number is increased, proper phase difference distribution needs to be performed according to the maximal phase discrimination ability. When the maximal phase discrimination ability is exceeded, the time-division manner may be used, that is, a first group of wavelengths are adjusted and locked in a first time slice, a second group of wavelengths are adjusted and locked in a second time slice, and so forth.

Step 202: Optically split and wavelength lock the modulated signals to acquire PD signals.

In step 202, the optical signals combined in step 201 are split to acquire a certain proportion of optical signals, which are wavelength locked to acquire the PD signals. The PD signals include a PD1 signal and a PD2 signal (herein, the PD1 signal always represents a first PD signal, and the PD2 signal always represents a second PD signal). The PD1 signal is not processed with an etalon, and the PD2 signal is processed with the etalon to acquire signal wavelength responsivity. The signal wavelength responsivity is acquired by passing the signals changed in transmission through the etalon after the signals in the wavelength channels are modulated by using the scrambling signals. The etalon is a grating array, which is sensitive to the wavelength of a signal, and by which a wavelength responsivity curve can be derived.

Optionally, after Step 202, the method may further include:

filtering the PD signals output from a wavelength locker including the etalon;

where the PD signals include the PD1 signal and the PD2 signal, in which the PD1 signal is not processed with the etalon, and the PD2 signal is processed with the etalon to acquire the signal wavelength responsivity.

Here, the filtering the PD signals output from the wavelength locker including the etalon may include:

amplifying the PD signals acquire the amplified PD signals;

filtering, by an analog filter, the amplified PD signals;

converting the filtered amplified PD signals into digital signals; and filtering, by a digital filter, the digital signals again.

Step 203: Perform phase discrimination on the PD signals, so as to acquire scrambling information of the different phases, in which the scrambling information includes wavelength information of the wavelength channels, and is contained in the signals changed in transmission, after the signals in the wavelength channels are modulated by using the injected scrambling signals.

Step 204: Determine wavelength-shift of the scrambling information of the different phases, so as to acquire different shift values corresponding to the wavelength information in the scrambling information of the different phases;

Step 204 further includes:

comparing the signal wavelength responsivity with pre-saved signal wavelength responsivity, so as to acquire a responsivity difference; and acquiring the different shift values corresponding to the wavelength information in the scrambling information of the different phases according to the responsivity difference, where the pre-saved signal wavelength responsivity may be saved after the signals in the wavelength channels are modulated by using the scrambling signals in step 201, optionally by saving the signal wavelength responsivity in a pre-defined table, for determining the wavelength-shift in the method embodiment.

Step 205: Adjust wavelengths of the wavelength channels of the different phases according to the different shift values.

In step 205, the wavelengths of the wavelength channels corresponding to the phases are adjusted by using wavelength feedback signals carrying the different shift values.

According to the first embodiment implementing the method of the present invention, a plurality of scrambling signals with the same frequency and different phases is injected into wavelength channels corresponding to the phases. In this way, the adjustment of multiple wavelengths is achieved, the cost and PCB area are greatly saved, and the complexity of a control circuit is lowered.

Figure 4:
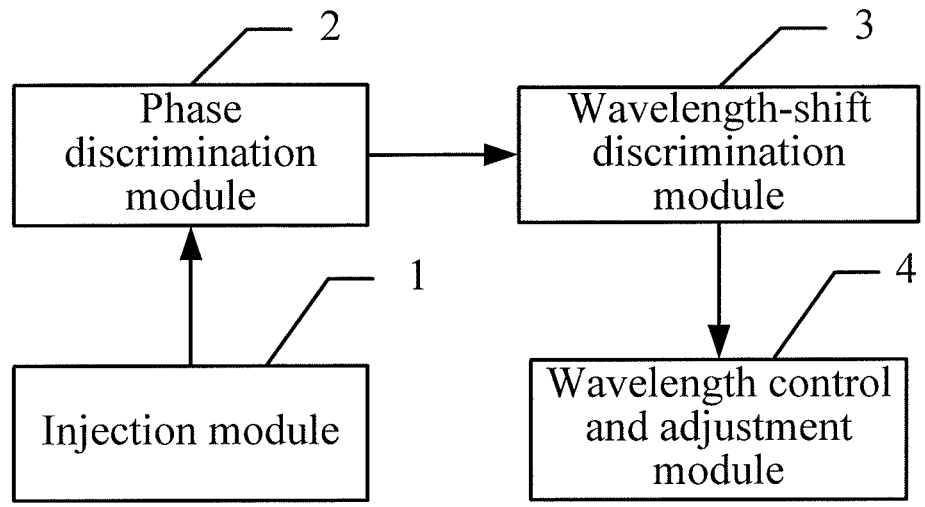
FIG. 4 is a schematic structural diagram of a wavelength adjusting apparatus according to an embodiment of the present invention.

FIG. 4 is a schematic structural diagram of a wavelength adjusting apparatus according to an embodiment of the present invention. As shown in FIG. 4, the apparatus includes an injection module 1, a phase discrimination module 2, a wavelength-shift discrimination module 3, and a wavelength control and adjustment module 4.

The injection module 1 is configured to inject scrambling signals with the same frequency and different phases respectively into wavelength channels correspondingly to the phases. In this embodiment, the scrambling signals with the same frequency and the different phases are generated by the injection module 1, and are injected respectively into the wavelength channels corresponding to the phases of the scrambling signals by the injection module 1. In practical operation, after the injection module 1 injects the scrambling signals into the wavelength channels corresponding to the phases of the scrambling signals, signals in the wavelength channels are modulated with a laser or a modulator, and the modulated signals are combined by a combiner, and then pass through a splitter, by which a certain proportion of optical signals are input into a wavelength locker including an etalon. The optical signals input into the wavelength locker are divided into two paths, one optical signal does not pass through the etalon, and the other optical signal passes through the etalon, the two optical signals are electro-optically converted to output PD signals, in which one is an electrical signal directly output after the electro-optical conversion without processing, serving as a reference signal in the subsequent determination of wavelength-shift, and the other is an electrical signal generated after being processed with the etalon and being electro-optically converted.

Optionally, the scrambling signals with the different phases may be injected into the wavelength channels corresponding to the phases in a time-division manner. In such a process, a time-division and phase-division injection sequence, as shown in FIG. 3, is used to inject the scrambling signals with the different phases into the wavelength channels corresponding to the phases. The time-division control sequence ensures that the scrambling signals are injected in time intervals of high level. The scrambling signals with the different phases are respectively injected into the different wavelength channels, so as to be finally modulated into high-speed electrical signals. If the wave number that needs wavelength lock is N, the phase of each channel wavelength should be sequentially spaced by 360°/N. In view of the phase discrimination ability of a phase discriminator in a subsequent perturbation retrieval process, when the channel number is increased, proper phase difference distribution needs to be performed according to a maximal phase discrimination ability of the phase discriminator. When the phase discrimination ability is exceeded, the time-division manner may be used, that is, a first group of wavelengths are adjusted and locked in a first time slice, a second group of wavelengths are adjusted and locked in a second time slice, and so forth.

The phase discrimination module 2 is configured to perform phase discrimination on PD signals, so as to acquire scrambling information of the different phases, in which the scrambling information contains wavelength information of the wavelength channels, and is contained in the signals changed in transmission, after the signals in the wavelength channels are modulated by using the injected scrambling signals. In this embodiment, the phase discrimination module 2 retrieves the scrambling information in the PD signals; and in practical operation, the phase discrimination module 2 may be a phase discriminator.

The wavelength-shift discrimination module 3 is configured to determine the wavelength-shift of the scrambling information of different phases acquired by the phase discrimination module 2, so as to acquire the different shift values corresponding to the wavelength information in the scrambling information of different phases.

The wavelength-shift discrimination module 3 may further include a comparison unit and an acquisition unit.

The comparison unit is configured to compare signal wavelength responsivity with pre-saved signal wavelength responsivity to acquire a responsivity difference.

The acquisition unit is configured to acquire the different shift values corresponding to the wavelength information in the scrambling information of the different phases according to the responsivity difference. The pre-saved signal wavelength responsivity may be saved after the signals in the wavelength channels are modulated by using the scrambling signals, optionally by saving the signal wavelength responsivity in a pre-defined table, for determining the wavelength-shift in the method embodiments.

The wavelength control and adjustment module 4 is configured to adjust wavelengths of the wavelength channels of the different phases according to the different shift values. In implementation, the wavelength control and adjustment module 4 adjusts the wavelengths of the wavelength channels corresponding to the phases by using wavelength feedback signals carrying the different shift values.

In the embodiment of the present invention, in a multi-wavelength transmission system, multiple lasers are arranged to form an array to be wavelength locked, in which the lasers share a wavelength control and adjustment module 4. In practical operation, the injection module 1 and the wavelength control and adjustment module 4 may be integrated into a scrambling signal injection and wavelength control unit, by which scrambling signals with the same frequency and different phases are injected according to different wavelengths.

Optionally, the wavelength adjustment apparatus may further include a filter module, which is connected respectively to a wavelength locker and the phase discrimination module 2, and configured to filter the PD signals output from the wavelength locker including an etalon. The PD signals include a PD1 signal and a PD2 signal, in which the PD1 signal is not processed with the etalon, and the PD2 signal is processed with the etalon to acquire the signal wavelength responsivity. In implementation, the filter includes a weak signal amplification unit, by which a weak signal output from the wavelength locker is amplified, and then filtered, so as to filter off an out-of-band noise. According to the embodiment of the present invention, the filter may be an analog filter, or a digital filter, or a combination thereof, and the frequency of the filter is the same as the frequency of the scrambling signals. Limited by the property of the amplification unit, the bandwidth of an analog filter cannot be made narrow enough. In order to more effectively retrieve the scrambling signals, and more accurately adjust the wavelengths, A/D sampling may be performed after the analog filter, so that analog signals are converted into digital signals, and the digital signals are further processed by a digital filter. The digital filter may be implemented by programming with a programmable device, such as Field Programmable Gate Array (FPGA), Application Specific Integrated Circuit (ASIC), Central Processing Unit (CPU), and Digital Signal Processor (DSP). In order to achieve better filtration performance, emulation is required, and the A/D sampling may use a dedicated high-speed Analog Digital Converter (ADC). The digital filter may be selected from a Finite Impulse Response (FIR) or an Infinite Impulse Response (IIR) filter, or a combination thereof, and the order thereof may be adjusted based on related parameters. When the scrambling frequency is changed, only the related parameters of the digital filter need to be altered; when the edge steepness of a filter window needs to be increased, only the order of the digital filter needs to be increased; and the commissioning process thereof may be implemented by using a JTAG or other interfaces of the actually used programmable device.

According to the embodiment implementing the wavelength adjusting apparatus of the present invention, a plurality of scrambling signals with a same frequency and different phases are injected into wavelength channels corresponding to the phases. In this way, the adjustment of multiple wavelengths is achieved, the cost and PCB area are greatly saved, and the complexity of a control circuit is lowered; the time-division and phase-division manner is used to adjust the wavelengths by injecting a single-frequency scrambling signal, so as to lock the wavelength; and the wavelengths of multiple channels may be adjusted in the same time slice.

Figure 5:
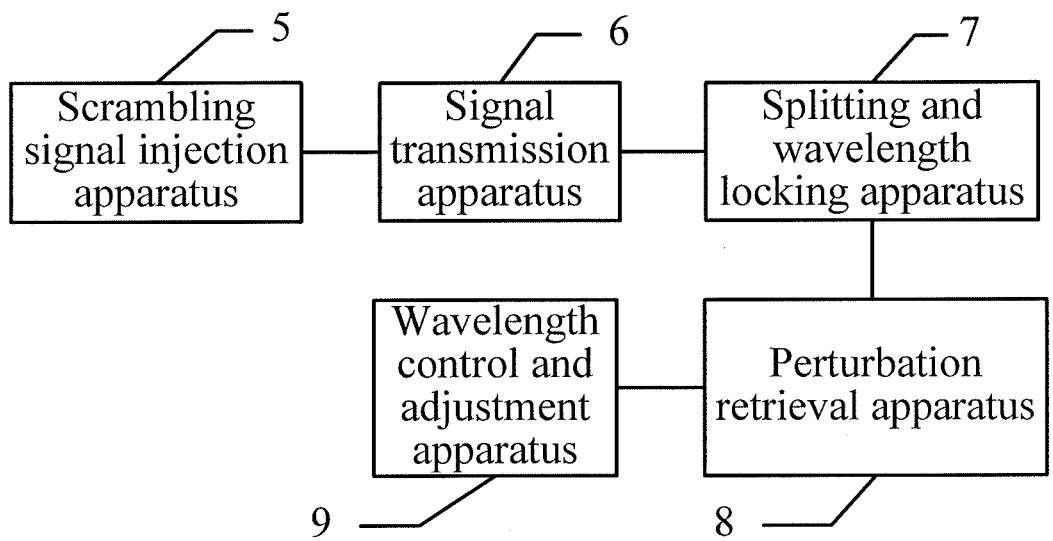
FIG. 5 is a schematic structural diagram of a first embodiment of a wavelength adjusting system according to the present invention.

FIG. 5 is a schematic structural diagram of a wavelength adjusting system according to a first embodiment of the present invention. As shown in FIG. 5, the system includes a scrambling signal injection apparatus 5, a signal transmission apparatus 6, a splitting and wavelength locking apparatus 7, a perturbation retrieval apparatus 8, and a wavelength control and adjustment apparatus 9.

The scrambling signal injection apparatus 5 is configured to generate scrambling signals with the same frequency and different phases and inject the scrambling signals respectively into wavelength channels corresponding to the phases.

The signal transmission apparatus 6 is configured to modulate and combine the signals in the wavelength channels. In implementation, the signal transmission apparatus 6 includes a laser/modulator, and a combiner.

The splitting and wavelength locking apparatus 7 is configured to optically split and wavelength lock the signals modulated and combined by the signal transmission apparatus 6 to acquire PD signals. In a specific embodiment, the splitting and wavelength locking apparatus 7 includes a splitter and a wavelength locker including an etalon, in which the splitter is configured to optically split the combined optical signals, so as to split a certain proportion of optical signals; and the wavelength locker is configured to wavelength lock the optical signals optically split by the splitter, so as to acquire the PD signals. The PD signals include a PD1 signal and a PD2 signal, in which the PD1 signal is not processed with the etalon, and the PD2 signal is processed with the etalon to acquire signal wavelength responsivity. The signal wavelength responsivity is acquired by passing the signals changed in transmission through the etalon after the signals in the wavelength channels are modulated by using the scrambling signals. The etalon is a grating array, which is sensitive to the wavelength of a signal, and by which a wavelength responsivity curve can be derived.

The perturbation retrieval apparatus 8 is configured to perform phase discrimination on the PD signals, so as to acquire scrambling information of different phases, in which the scrambling information includes wavelength information of the wavelength channels; and determine wavelength-shift of the scrambling information of the different phases, so as to acquire different shift values corresponding to the wavelength information in the scrambling information of the different phases. In implementation, the perturbation retrieval apparatus 8 may be configured to compare the signal wavelength responsivity with pre-saved signal wavelength responsivity to acquire a responsivity difference; and acquire the different shift values corresponding to the wavelength information in the scrambling information of the different phases according to the responsivity difference. The pre-saved signal wavelength responsivity may be saved after the signals in the wavelength channels are modulated by using the scrambling signals, optionally by saving the signal wavelength responsivity in a pre-defined table, for determining the wavelength-shift in the method embodiments.

The wavelength control and adjustment apparatus 9 is configured to adjust the wavelength channels of the different phases according to the different shift values. Specifically, the wavelength control and adjustment apparatus 9 adjusts the wavelengths of the wavelength channels corresponding to the phases by using wavelength feedback signals carrying the different shift values.

Optionally, the perturbation retrieval apparatus 8 further includes a filter, a phase discriminator, and a wavelength-shift discriminator.

The filter is configured to filter the PD signals output from the wavelength locker comprising the etalon. The PD signals include the PD1 signal and the PD2 signal, in which the PD1 signal is not processed with the etalon, and the PD2 signal is processed with the etalon to acquire the signal wavelength responsivity.

The phase discriminator is configured to perform phase discrimination on the PD signals filtered by the filter, so as to acquire the scrambling information of the different phases.

The wavelength-shift discriminator is configured to determine the wavelength-shift of the scrambling information of different phases, so as to acquire the different shift values corresponding to the wavelength information in the scrambling information of different phases.

Figure 6:
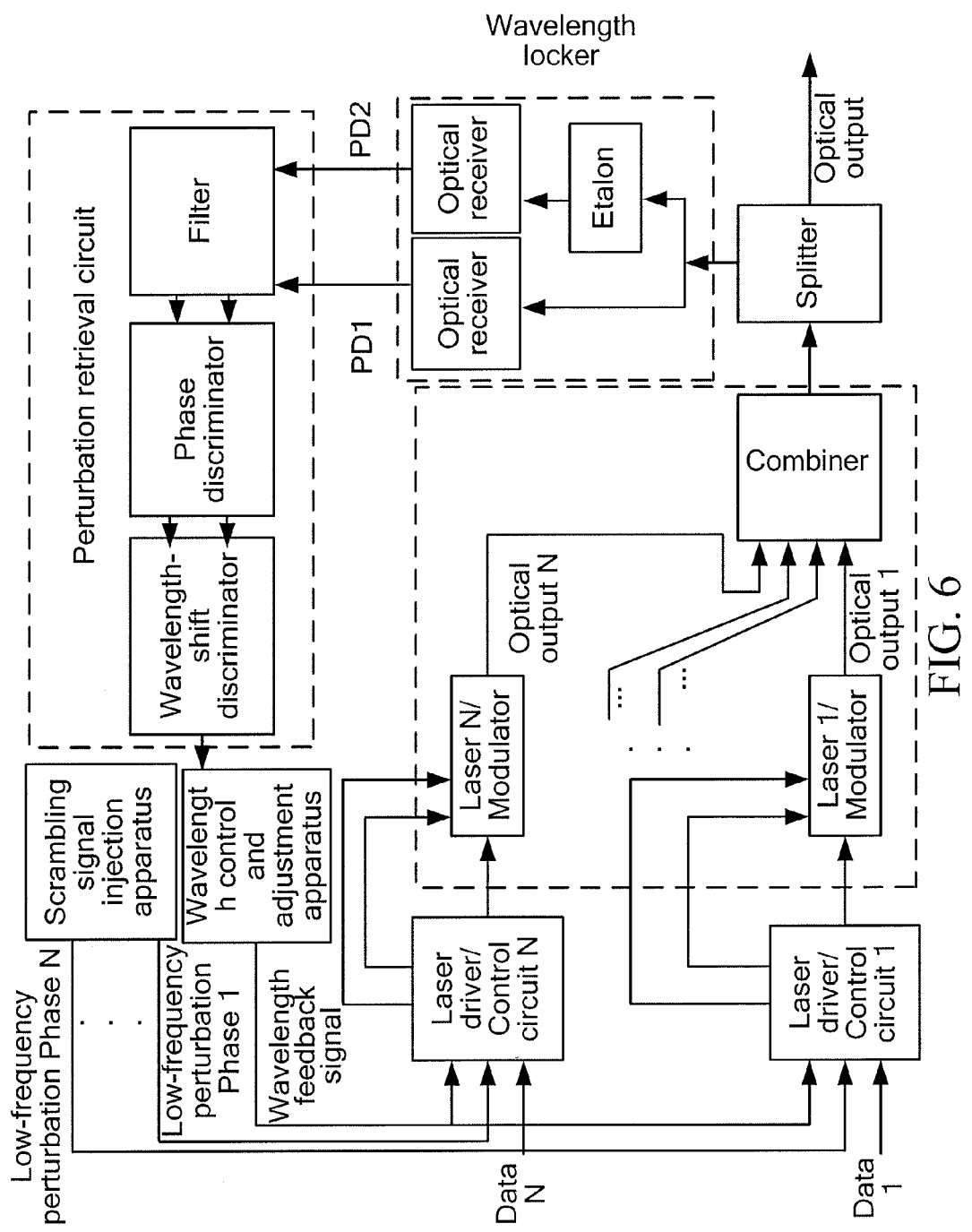
FIG. 6 is a schematic structural diagram of a second embodiment of a wavelength adjusting system according to the present invention.

Next, a second embodiment of the wavelength adjusting system according to the present invention is described in detail with reference to FIG. 6. FIG. 6 is a schematic structural diagram of the second embodiment of the wavelength adjusting system according to the present invention. As shown in FIG. 6, a perturbation retrieval circuit in FIG. 6 is equivalent to the perturbation retrieval apparatus 8 in FIG. 5, a combination of a laser/modulator with a combiner is equivalent to the signal transmission apparatus 6 in FIG. 5, a combination of a splitter with a wavelength locker is equivalent to the splitting and wavelength locking apparatus 7.

In this embodiment, scrambling signals with the same frequency and different phases are generated by a scrambling signal injection apparatus, and are injected by the scrambling signal injection apparatus into multiple wavelength channels. The laser/modulator modulates signals in corresponding wavelength channels by using the scrambling signals with the same frequency and the different phases. The combiner combines the modulated multiple signals, so as to acquire optical signals output after combining multiple wavelengths. A certain proportion of the combined optical signals are input, through the splitter, into the wavelength locker including an etalon. Two paths of PD signals including a PD1 signal and a PD2 signal are output from the wavelength locker, in which the PD1 signal is not processed with the etalon, and the PD2 signal is processed with the etalon to acquire signal wavelength responsivity. The signal wavelength responsivity is acquired by passing the signals changed in transmission through the etalon after the signals in the wavelength channels are modulated by using the scrambling signals. The etalon is a grating array, which is sensitive to the wavelength of a signal, and by which a wavelength responsivity curve can be derived. The PD signals include injected scrambling information, in which the scrambling information is contained in the signals changed in transmission, after the signals in the wavelength channels are modulated by using the injected scrambling signals, and only can be retrieved by a special perturbation retrieval circuit, and used for wavelength adjusting and locking.

The perturbation retrieval circuit includes a filter, a phase discriminator, and a wavelength-shift discriminator. The filter includes a weak signal amplification unit, by which a weak signal output from the wavelength locker is amplified, and then filtered, so as to filter off an out-of-band noise. According to the embodiment of the present invention, the filter may be an analog filter, or a digital filter, or a combination thereof, and the frequency of the filter is the same as the frequency of the scrambling signals. Limited by the property of the amplification unit, the bandwidth of an analog filter cannot be made narrow enough. In order to achieve better filter performance, more effectively retrieve the scrambling signals and more accurately adjust the wavelength, A/D sampling may be performed after the analog filter, so that analog signals are converted into digital signals, and the digital signals are further processed by a digital filter. The digital filter may be implemented by programming with a programmable device, such as FPGA, ASIC, CPU, and DSP. In order to achieve better filtration performance, emulation is required, and the A/D sampling may use a dedicated high-speed ADC. The digital filter may be selected from a FIR or an IIR filter, or a combination thereof, and the order thereof may be adjusted based on related parameters. When the scrambling frequency is changed, only the related parameters of the digital filter need to be altered; when the edge steepness of a filter window needs to be increased, only the order of the digital filter needs to be increased; and the commissioning process thereof may be implemented by using a JTAG or other interfaces of the actually used programmable device.

The phase discriminator is mainly configured to discriminate different channel wavelengths by discriminating phases, so as to adjust corresponding wavelengths, thereby locking the wavelengths.

The filter and the phase discriminator outputs the PD signals with the out-of-band noise being filtered off to the wavelength-shift discriminator, and the wavelength-shift discriminator determines wavelength-shift of the scrambling signals with the different phases, so as to acquire the different shift values corresponding to the scrambling signals with the different phases. Herein, the wavelength-shift discriminator may compare the signal wavelength responsivity with pre-saved signal wavelength responsivity to obtain a responsivity difference; and the different shift values corresponding to the wavelength information in the scrambling information of the different phases are acquired according to the responsivity difference. The pre-saved signal wavelength responsivity may be saved after the signals in the wavelength channels are modulated by using the scrambling signals, optionally by saving the signal wavelength responsivity in a pre-defined table, for determining the wavelength-shift in the method embodiments.

The wavelength control and adjustment apparatus delivers different DA control signals to corresponding laser drivers and control circuits according to the difference of the shift values for adjusting the wavelengths, thereby locking the wavelengths. Specifically, the wavelength control and adjustment apparatus adjusts the wavelengths of the wavelength channels corresponding to the phases by using wavelength feedback signals carrying the different shift values.

In this embodiment, the scrambling signal injection module may inject the scrambling signals with the different phases into the wavelength channels corresponding to the phases in a time-division manner. In such a process, a time-division and phase-division injection sequence of the scrambling signals, as shown in FIG. 3, is used to inject the scrambling signals with the different phases into the wavelength channels corresponding to the phases. The time-division control sequence ensures that the scrambling signals are injected in time intervals of high level. The scrambling signals with the different phases are respectively injected into the different wavelength channels, so as to be finally modulated into high-speed electrical signals. If the wave number that needs wavelength lock is N, the phase of each channel wavelength should be sequentially spaced by 360°/N. In view of a phase discrimination ability of the phase discriminator in subsequent perturbation retrieval, when the channel number is increased, proper phase difference distribution needs to be performed according to the maximal phase discrimination ability of the phase discriminator. When the phase discrimination ability is exceeded, the time-division manner may be used, that is, a first group of wavelengths are adjusted and locked in a first time slice, a second group of wavelengths are adjusted and locked in a second time slice, and so forth.

The method and apparatus of the present invention are applicable in a multi-wavelength system composed of a splitter module and a laser. In addition, an optoelectronic integrated device PID/PIC may also use the embodiment of the present invention for adjusting the wavelengths, thereby locking the wavelengths.

According to the embodiment of the present invention, a plurality of scrambling signals with the same frequency and different phases are injected into wavelength channels corresponding to the phases. In this way, the adjustment of multiple wavelengths is achieved, the cost and PCB area are greatly saved, and the complexity of a control circuit is lowered.

Through the above description of the implementation, it is clear to persons skilled in the art that the present invention may be implemented through software plus a necessary hardware platform, or completely through hardware. Based on this, the contribution of the technical solutions of the present invention to the prior art may be entirely or partly embodied in the form of a software product. The computer software product may be stored in a storage medium (for example, ROM/RAM, magnetic disk or optical disk) and contain several instructions for instructing computer equipment (for example, personal computer, server, or network equipment) to perform the method described in each embodiment or some portions of the embodiments of the present invention.

The above descriptions are merely exemplary embodiments of the present invention, but are not intended to limit the scope of the claims of the present invention. Therefore, any equivalent modification made according to the claims of the present invention should fall within the scope of the present invention.

What is claimed is:

1. A wavelength adjusting method, comprising:
   modulating, by using scrambling signals with a same frequency and different phases, signals in wavelength channels corresponding to the different phases;
   optically splitting and wavelength locking the modulated signals, to acquire photoelectricity detector (PD) signals;
   performing phase discrimination on the PD signals, so as to acquire scrambling information of the different phases, wherein the scrambling information comprises wavelength information of the wavelength channels;

determining wavelength-shift of the scrambling information of the different phases, so as to acquire different shift values corresponding to the wavelength information in the scrambling information of the different phases; and adjusting wavelengths of the wavelength channels of the different phases according to the different shift values;

wherein before the performing the phase discrimination on the PD signals, so as to acquire the scrambling information of the different phases the method further comprises:

filtering the PD signals output from a wavelength locker comprising an etalon;
   wherein the PD signals comprise a first photoelectricity detector signal (PD1 signal) and a second photoelectricity detector signal (PD2 signal), wherein the PD1 signal is not processed with the etalon, and the PD2 signal is processed with the etalon to acquire signal wavelength responsivity; and wherein the determining the wavelength-shift of the scrambling information of the different phases, so as to acquire the different shift values corresponding to the wavelength information in the scrambling information of the different chases comprises:

comparing the signal wavelength responsivity with pre-saved signal wavelength responsivity to acquire a responsivity difference; and acquiring the different shift values corresponding to the wavelength information in the scrambling information of the different phases according to the responsivity difference.

2. The method according to claim 1, wherein the modulating, by using the scrambling signals with the same frequency and the different phases, the signals in the wavelength channels corresponding to the different phases comprises:

generating the scrambling signals with the same frequency and the different phases;

injecting the scrambling signals with the same frequency and the different phases respectively into the wavelength channels corresponding to the different phases; and modulating the signals in the wavelength channels according to the scrambling signals.

3. The method according to claim 2, wherein the injecting the scrambling signals with the same frequency and the different phases respectively into the wavelength channels corresponding to the different phases comprises injecting the scrambling signals with the same frequency and the different phases into the wavelength channels corresponding to the phases in a time-division manner.

4. The method according to claim 1, wherein the filtering the PD signals output from the wavelength locker comprising the etalon comprises:

amplifying the PD signals to acquire amplified PD signals;
filtering, by an analog filter, the amplified PD signals;
converting the filtered amplified PD signals into digital signals; and
filtering, by a digital filter, the digital signals again.

5. A wavelength adjusting apparatus, comprising:
an injection module, configured to inject scrambling signals with a same frequency and different phases respectively into wavelength channels corresponding to the different phases;
a phase discrimination module, configured to perform phase discrimination on photoelectricity detector (PD) signals, so as to acquire scrambling information of different phases, wherein the scrambling information comprises wavelength information of the wavelength channels;
a wavelength-shift discrimination module, configured to determine wavelength-shift of the scrambling information of the different phases acquired by the phase discrimination module, so as to acquire different shift values corresponding to the wavelength information in the scrambling information of the different phases;
a wavelength control and adjustment module, configured to adjust wavelengths of the wavelength channels of the different phases according to the different shift values; and
a filter module, configured to filter the PD signals output from a wavelength locker comprising an etalon, wherein the PD signals comprise a first photoelectricity detector signal (PD1 signal) and a second photoelectricity detector signal (PD2 signal), wherein the PD1 signal is not processed with the etalon, and the PD2 signal is processed with the etalon to acquire signal wavelength responsivity;
wherein the wavelength-shift discrimination module comprises:
a comparison unit configured to compare the signal wavelength responsivity with pre-saved signal wavelength responsivity to acquire a responsivity difference; and
an acquisition unit configured to acquire the different shift values corresponding to the wavelength information in the scrambling information of the different phases according to the responsivity difference.

6. The apparatus according to claim 5, wherein the injection module is further configured to generate the scrambling signals with the same frequency and the different phases.

7. The apparatus according to claim 5, wherein the injection module injects the scrambling signals with the same frequency and the different phases into the wavelength channels corresponding to the different phases in a time-division manner.

8. The apparatus according to claim 6, wherein the injection module injects the scrambling signals with the same frequency and the different phases into the wavelength channels corresponding to the different phases in a time-division manner.

9. A wavelength adjusting system, comprising:
a scrambling signal injection apparatus, configured to generate scrambling signals with a same frequency and different phases and inject the scrambling signals respectively into wavelength channels corresponding to the different phases;
a signal transmission apparatus, configured to modulate and combine the signals in the wavelength channels;
a splitting and wavelength locking apparatus, configured to optically split and wavelength lock the signals modulated and combined by the signal transmission apparatus, so as to acquire photoelectricity detector (PD) signals;
a perturbation retrieval apparatus, configured to perform phase discrimination on the PD signals, so as to acquire scrambling information of the different phases, wherein the scrambling information comprises wavelength information of the wavelength channels; and determine wavelength-shift of the scrambling information of the different phases, so as to acquire different shift values corresponding to the wavelength information in the scrambling information of the different phases; and a wavelength control and adjustment apparatus, configured to adjust the wavelength channels of the different phases according to the different shift values;

wherein the perturbation retrieval apparatus further comprises:

a filter, configured to filter the PD signals output from a wavelength locker comprising an etalon wherein the PD signals comprise a first photoelectricity detector signal (PD1 signal) and a second photoelectricity detector signal (PD2 signal) wherein the PD1 signal is not processed with the etalon, and the PD2 signal is processed with the etalon to acquire signal wavelength responsivity;

a phase discriminator configured to perform phase discrimination on the PD signals filtered by the filter, to acquire the scrambling information of the different phases; and a wavelength-shift discriminator configured to compare the signal wavelength responsivity with pre-saved signal wavelength responsivity to acquire a responsivity difference and acquire the different shift values corresponding to the wavelength information in the scrambling information of the different phases according to the responsivity difference.

* * * * *